United States Patent [19]

Shimoyama et al.

[11] Patent Number: 5,240,903
[45] Date of Patent: Aug. 31, 1993

[54] OXIDE SUPERCONDUCTOR COMPRISING BABO$_3$ DISPERSIONS (WHERE B IS ZR, SN, CE OR TI)

[75] Inventors: Jun-ichi Shimoyama; Toshiya Matsubara; Takeshi Morimoto; Shinji Kondoh, all of Yokohama, Japan

[73] Assignee: Asahi Glass Company Ltd., Tokyo, Japan

[21] Appl. No.: 693,590

[22] Filed: Apr. 30, 1991

[30] Foreign Application Priority Data

May 10, 1990 [JP] Japan .................................. 2-118775
Jun. 12, 1990 [JP] Japan .................................. 2-151609

[51] Int. Cl.$^5$ ...................... C01F 11/02; C01F 17/00; C01G 3/02; H01L 39/12
[52] U.S. Cl. .................................. 505/1; 252/521; 505/785
[58] Field of Search .................... 505/1, 785; 501/135; 252/521

[56] References Cited

U.S. PATENT DOCUMENTS

| | | | |
|---|---|---|---|
| 3,960,779 | 6/1976 | Rosenblatt | 501/135 |
| 4,755,493 | 7/1988 | Takeuchi | 501/135 |
| 5,084,436 | 1/1992 | Morimoto | 505/785 |

FOREIGN PATENT DOCUMENTS

WO90/04856 5/1990 PCT Int'l Appl. .

OTHER PUBLICATIONS

Goyal "Cermets of the YBa$_2$Cu$_3$O$_7$ Superconductors" Mat'ls Letters vol. 6 (8,9) May 1988 pp. 251–260.

Xin "A Study of Superconducting Oxide Y-Ba-Cu-Sn-O" Int'l Jnl Mod. Phys. B vol. 1 (2) 1987 pp. 277–280.
Shimoyama "Addition of New Pinning Center to Unidirectionally ... " Jap. Jnl. Appl. Phys. vol. 29 (11) Nov. 1990 pp. L1999–L2001.
Osamura "Improvement of Critical Current Density in YBa$_2$Cu$_3$O$_6$" Jap. Jnl. Appl. Phys. vol. 29(9) Sep. 1990 pp. L1621–L1623.
McGinn "Microstructure and critical current density of zone ... " Appl. Phy. Lett vol. 59(1) Jul. 1, 1991 pp. 120–123.
Japanese Journal of Applied Physics, vol. 29, No. 2, pp. 277–279, Feb. 1990, Jun-ichiro Kase, et al., "Preparation of Y-Ba-Cu-O Superconductors with High Critical Current Density by Unidirectional Melt Solidification".
Japanese Journal of Applied Physics, vol. 28, No. 7, pp. 1204–1206, Jul. 1989, Takeshi Hikata, et al., "Electromagnetic Properties and Morphology of Ag-Sheathed Bi-Pb-Sr-Ca-Cu-O Superconducting Wires".
Physica C, vol. 159, No. 3, pp. 287–294, Jun. 15, 1989, D. E. Morris, et al., "Stability of 124, 123, and 247 Superconductors".

*Primary Examiner*—Paul Lieberman
*Assistant Examiner*—John Boyd
*Attorney, Agent, or Firm*—Oblon, Spivak, McClelland, Maier & Neustadt

[57] ABSTRACT

An oxide superconductor having a structure such that a double oxide of at least one metal selected from the Group 2A elements and at least one metal selected from the Group 4A, Group 4B and rare earth elements, is dispersed in oxide superconductor crystals.

5 Claims, 1 Drawing Sheet

- 123-phase
- BaMO₃
- 211-phase

- 123-phase
- 211-phase

OXIDE SUPERCONDUCTOR COMPRISING BABO$_3$ DISPERSIONS (WHERE B IS ZR, SN, CE OR TI)

The present invention relates to an oxide superconductor having a novel structure and a process for its production.

Heretofore, oxide superconductors of e.g. RE-Ba-Cu-O system, Bi-Sr-Ca-Cu-O system and Tl-Ba-Ca-Cu-O system have been known as superconductors showing superconductivity at relatively high temperatures.

As the superconductor of RE-Ba-Cu-O system, a superconductor having a composition of the formula REBa$_2$Cu$_3$O$_y$ or RE$_2$Ba$_4$Cu$_8$O$_y$ wherein RE is at least one member selected from the group consisting of Y, La, Nd, Sm, Eu, Gd, Dy, Ho, Er, Tm, Yb and Lu, and y is the amount of oxygen, has been known.

The superconductor of Bi-Sr-Ca-Cu-O system is known to have three types of structures i.e. Bi$_2$Sr$_2$Ca$_2$Cu$_3$O$_y$, Bi$_2$Sr$_2$CaCu$_2$O$_y$ and Bi$_2$Sr$_2$CuO$_y$, which have critical temperatures of about 110° K., 80° K. and 20° K., respectively. The research and development for practical application at the liquid nitrogen temperature (77° K.) are being conducted primarily with respect to Bi$_2$Sr$_2$Ca$_2$Cu$_3$O$_y$ and Bi$_2$Sr$_2$CaCu$_2$O$_y$ which have high critical temperatures.

The superconductor of Tl-Ba-Ca-Cu-O system includes Tl$_2$Ba$_2$Ca$_2$Cu$_3$O$_y$, Tl$_2$Ba$_2$CaCu$_2$O$_y$, Tl$_2$Ba$_2$Ca$_3$Cu$_4$O$_y$ and many other phases. The critical temperatures of most of such phases are known to be higher than the liquid nitrogen temperature (77° K.).

As a method for producing such an oxide superconductor, there is a method wherein powders of raw materials are mixed in the above composition, and then the mixture is compacted and sintered. A superconductor produced by sintering is usually polycrystals containing pores, wherein crystal grains are randomly oriented, and the bond between the crystal grains is weak. Further, according such a method, non-superconducting phases are usually present at grain boundaries, and they act as insulating layers. Furthermore, an oxide superconductor has a predetermined direction in the crystal grains in which an electric current readily flows. Therefore, the current tends to hardly flow through grain boundaries between crystal grains aligned in different directions. For these reasons, with conventional polycrystal superconductors, it has been difficult to obtain a high critical current density.

Whereas, if an oxide superconductor is produced by a melt-solidification method, there is a possibility that the crystal grains grow to a large extent, and it is thereby possible to obtain a highly dense superconductor having a strong bond between crystal grains and having no grain boundary phase. Particularly, there have been many reports indicating that superconductors having a high critical current density can be obtained by producing a single crystal or an aligned polycrystal oxide superconductor by melt-solidifying method.

Further, it is also known to obtain a tape-shaped superconductor material by combining a thick film of oxide superconductor and a metal substrate. For example, there is a method which comprises dispersing calcined powder having a composition of YBa$_2$Cu$_3$O$_y$ in an organic solvent containing an acrylic type binder, coating the dispersion on a metal substrate, followed by heat treatment to bake a thick film, or a method which comprises preparing a green sheet by a doctor blade casting and baking the green sheet on a metal substrate. In such a case, it is known to press the thick film in an attempt to improve the critical current density.

It is reported that also in the case of a thick film oxide superconductor as in the case of a bulk, by solidifying after the partial melting on a metal substrate, a dense thick film can be obtained and superconductor crystals are oriented in a direction to improve the critical current density.

By a unidirectional melt-solidification method, the critical current density of an oxide superconductor can further be increased, but the critical current density at a liquid nitrogen temperature tends to substantially decrease in a magnetic field. This is believed attributable to the fact that with an oxide superconductor, the pinning force is weak against the fluxoid flowing in the crystals in a magnetic field higher than the lower critical magnetic field.

With respect to the application field of superconductors, they are considered useful primarily as magnets capable of providing strong magnetic fields in the form of wire material or tape material formed into a coil. Therefore, for the practical application of oxide superconductors, it is necessary to prepare a material having a high critical current density in a strong magnetic field. Accordingly, it has been attempted to prepare a structure which is dense and has the direction of crystals aligned and to introduce pinning centers to the superconductor crystals to increase the pinning force. Here, as the pinning centers, various defects such as fine precipitates of a non-superconductor, grain boundaries and twin boundaries may be considered.

When heated at a temperature of about 1100° C. in the atmosphere, REBa$_2$Cu$_3$O$_y$ as a superconductor of RE-Ba-Cu-O system melts incongruently to form RE$_2$BaCuO$_5$ crystals and a liquid phase, without forming a uniform melt. Therefore, when this melt is solidified, by controlling the composition of the melt and the solidification conditions, it is possible to obtain a superconductor having a structure such that non-superconducting RE$_2$BaCuO$_5$ crystals are finely dispersed in the REBa$_2$Cu$_3$O$_y$ crystals having superconductivity. The present inventors have previously reported that a superconductor having a structure in which granular crystals of RE$_2$BaCuO$_5$ are uniformly dispersed in a matrix of oriented REBa$_2$Cu$_3$O$_y$, has a high critical current density (Japanese Unexamined Patent Publication No. 204322/1990 which corresponds to U.S. patent application Ser. No. 471650 filed Jan. 29, 1990).

It is believed that the critical current density can be further improved by finely dispersing the precipitates of non-superconductor such as RE$_2$BaCuO$_5$. However, the above-mentioned melt-solidification is a peritectic reaction, and it is difficult to realize uniform dispersion of the RE$_2$BaCuO$_5$ phase unless the amounts and the nature of the RE$_2$BaCuO$_5$ phase and the melt in the melting zone are precisely controlled. Further, RE$_2$BaCuO$_5$ tends to localize in the partially melted state due to the surface tension of the liquid phase. Accordingly, it is likely in many cases that the critical current density varies at different portions of the material. Also with RE$_2$Ba$_4$Cu$_8$O$_y$, a structure having RE$_2$BaCuO$_5$ dispersed therein can be obtained in the same manner as in the case of REBa$_2$Cu$_3$O$_y$, but it is likewise difficult to control the dispersion uniformly.

On the other hand, in the case of oxide superconductors of Bi-Sr-Ca-Cu-O system or Tl-Ba-Ca-Cu-O system, even when melted and solidified, non-superconductor crystals such as $RE_2BaCuO_5$ observed in the case of the superconductor of RE-Ba-Cu-O system do not precipitate in the superconductor crystals, and effective pinning centers have not been known.

It is an object of the present invention is to provide a superconductor having highly-effective pinning centers introduced in oxide superconductor crystals, and a process for its production.

The present invention provides an oxide superconductor having a structure such that granular crystals of a double oxide of at least one metal selected from the Group 2A elements and at least one metal selected from the Group 4A, Group 4B and rare earth elements, are dispersed in oxide superconductor crystals.

The present invention also provides a process for producing such an oxide superconductor, which comprises molding a mixture comprising a powder having a composition of an oxide superconductor and a double oxide of at least one metal selected from the Group 2A elements and at least one metal selected from the Group 4A, Group 4B and rare earth elements, heating the molded mixture to a temperature for partial melting of the oxide superconductor, and then solidifying it.

Figure 1:
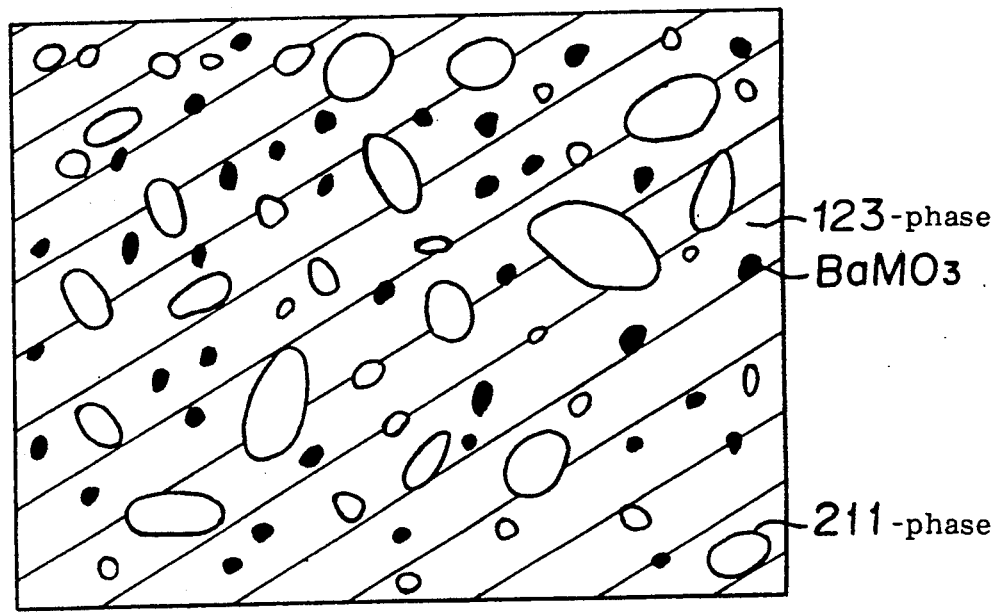
FIG. 1 is a diagrammatical view illustrating the structure of the superconductor obtained in Examples 1 and 2.

Now, the present invention will be described in detail with reference to the preferred embodiments.

In the present invention, the double oxide is preferably the one represented by the compositional formula $ABO_3$ wherein A is at least one metal selected from Mg, Ca, Sr and Ba, and B is at least one metal selected from Zr, Sn, Ce and Ti. In this case, the resulting $ABO_3$ crystals will have a very stable perovskite structure. Such crystals are stable up to about 1200° C. in the atmosphere and do not react with the melt of oxide superconductor, and they undergo no substantial grain growth at this temperature. The temperature for partial melting of RE-Ba-Cu-O system is from 980° to 1100° C., the temperature for partial melting of Bi-Sr-Ca-Cu-O system is from 880° to 920° C., and the temperature for partial melting of Tl-Ba-Ca-Cu-O system is from 910° to 980° C.

In the present invention, the oxide superconductor is not particularly limited. The present invention is effective in any system such as a RE-Ba-Cu-O system (an oxide containing RE, Ba and Cu as constituting elements), a Bi-Sr-Ca-Cu-O system (an oxide containing Bi, Sr, Ca and Cu as constituting elements) or a Tl-Ba-Ca-Cu-O system (an oxide containing Tl, Ba, Ca and Cu as constituting elements). In a case where the oxide superconductor is of a RE-Ba-Cu-O system, it is preferred that A in the above-mentioned $ABO_3$ is Ba, since no bivalent metal capable of substituting Ba will be introduced into the superconductor and there will be no possibility of impairing the superconducting characteristics. It is particularly preferred that $ABO_3$ is $BaSnO_3$, since the system is thereby particularly stable.

It is preferred that the double oxide is contained in an amount of from 1 to 20 vol % in the superconductor crystals. If the content is less than 1 vol %, no adequate pinning effects by the double oxide tend to be obtained, such being undesirable. On the other hand, if the content exceeds 20 vol %, crystals of the double oxide are likely to segregate partially in the material, whereby discontinuity is likely to result in the superconductor, such being undesirable. More preferably, the content of the double oxide is from 5 to 12 vol %.

The process for producing the superconductor of the present invention is not particularly restricted so long as it is a process capable of obtaining the above structure. Various methods may be employed. It is, however, preferred to employ a process which comprises mixing a powder of the above double oxide to the starting material having a composition of an oxide superconductor, heating the mixture to a level of at least the incongruent melting temperature of the oxide superconductor crystals, followed by cooling for solidification, since it is thereby possible to obtain a superconductor which is dense and has the above compound oxide uniformly dispersed in the superconductor crystals.

Specifically, the following process is preferred. An oxide superconductor is preliminarily prepared, and it is finely pulverized. Then, it is mixed with a fine powder of the above compound oxide such as $BaSnO_3$. This mixture is molded by e.g. a compression molding method. This molded product is heated to a level of at least the incongruent melting temperature to obtain a state in which particles of the above compound oxide are dispersed in the melt of the oxide superconductor. Preferably, from this state, solidification is unidirectionally conducted with a temperature gradient. At that time, from the melt, crystals of the oxide superconductor form and grow by a peritectic reaction.

As the conditions for unidirectional solidification, it is preferred to unidirectionally solidifying superconductor crystals from the melt with a temperature gradient of at least 20° C./cm, more preferably at least 50° C./cm, at a grain growth rate of not higher than 20 mm/hr, more preferably not higher than 5 mm/hr, whereby it is possible to obtain a solidified product having a structure such that granular crystals of the above double oxide are insularly dispersed in a matrix of plate crystals of superconductor phase oriented and overlaid one on another.

During this operation, the above double oxide such as $BaSnO_3$ undergoes no substantial change such as decomposition, dissolution or grain growth. Accordingly, it is included in the solidified product while maintaining the same particle shape as mixed to the oxide superconductor powder. Namely, if the above double oxide is used as classified to be composed of fine particles only, it is possible to disperse the non-superconductor substance of the same fine particle size in the superconductor crystals, such being desirable with a view to improving the pinning force. Particularly when only particles of not larger than 0.5 μm are used, the critical current density can be remarkably increased.

Otherwise, instead of adding crystals of the double oxide from the beginning, it is also possible to form crystals of the double oxide by a reaction during the melting of the superconductor. For example, a powder of a superconductor composition of RE-Ba-Cu-O system having an excess amount of Ba added which is equivalent to the tin to be added, is preliminarily prepared, and then fine powder of tin metal is added thereto. Then, the mixture is heated and melted, whereby the Sn and Ba are reacted in the melt to form barium stannate particles.

In the present invention, the oxide superconductor may be formed into a thick film, which may then be formed into a tape. The superconductor tape is preferably produced in a state laminated on a metal plate not reactive with the melt of the superconductor, or in a metal tube pressed to be flat. In such a case, when crystals grow from the melt, the c axes of superconductor crystals grow vertically to the metal surface due to the surface tension of the melt, whereby it is possible to obtain a superconductor tape having the direction of crystals aligned. Also with such a tape material, the orientation of the superconductor is further improved by unidirectionally melt-solidifying the superconductor under a temperature gradient.

The oxide superconductor tape material of the present invention is preferably produced by the following method. For example, a powder of the above double oxide is mixed to raw materials having substantially the same composition as the oxide superconductor, to obtain a starting material. To such a starting material, an organic solvent, a binder, etc. are added to obtain a slurry. The slurry is coated on a substrate by e.g. screen printing. Otherwise, it is formed into a thick film green sheet by a doctor blade casting, and the green sheet is laminated on a substrate, followed by heat treatment. As the substrate, a metal is preferred. When a metal of a tape form or a foil form is employed, it is possible to impart flexibility to the superconductor tape. It can also be produced by filling a powder of the starting material in a metal tube, then pressing the metal tube into a tape, followed by melting and solidification.

The metal to be used for the substrate is not particularly limited so long as its reactivity with the superconductor in a molten state is small. Specifically, gold, silver, palladium or an alloy composed mainly thereof, is preferred.

In the case of a superconductor of RE-Ba-Cu-O system, the melting temperature is high at a level of from 1000° to 1080° C. as compared with other systems. Therefore, when silver is used as the metal for the substrate, the melting and solidification method can not be used. However, if a copper or copper oxide layer is formed on the surface of a silver substrate and heating is conducted by placing a thick film molded product for superconductor of RE-Ba-Cu-O system thereon, the copper or copper oxide acts as flux, and therefore it is possible to form a melt of the oxide even at a temperature lower than the melting point of silver. Thus, it is possible to form a dense thick film of an oxide superconductor on the silver substrate by a melting and solidification method.

In the present invention, the oxide superconductor can be formed into a thin film. In the thin film, it is preferred that the above double oxide crystals are finer than in the case of a bulk. Namely, the particle size is preferably not larger than 500 Å, more preferably not larger than 200 Å. For the production of a thin film of an oxide superconductor of the present invention, it is preferred to employ a method wherein during the deposition step of the thin film of the superconductor, the starting materials for the above compound oxide are simultaneously vaporized so that fine particles of the above compound oxide are simultaneously deposited. Otherwise, during the film forming of the superconductor, a gas having fine powder of the above double oxide mixed, may be introduced.

The step for depositing the thin film of the superconductor is not particularly limited, and a method such as vapor deposition, sputtering, CVD (chemical vapor deposition) or laser ablation, may be employed. In either method, it is preferred to deposit the thin film on a substrate heated to a temperature of from 400° to 900° C. As a result, it is possible to obtain a thin film having a structure such that fine particles of the non-superconductive double oxide are dispersed in the oriented superconductor.

The material of the substrate useful for forming the thin film is not particularly limited, and various materials including various refractory alloys and ceramics may be employed.

With respect to an oxide superconductor of RE-Ba-Cu-O system, if the following method is employed to produce a superconductor of the present invention by a melting and solidification method, it is possible to further improve the superconducting characteristics.

Namely, when granular crystals of $RE_2BaCuO_5$ phase are present in the $REBa_2Cu_3O_y$ phase during the solidification step from the melt, no other non-superconductive crystal phase or amorphous phase will be formed at the grain boundaries of the $REBa_2Cu_3O_y$ phase, and the orientation of the $REBa_2Cu_3O_y$ phase is improved by the unidirectional solidification method. Therefore, the critical current density of the superconductor will be further improved. It is preferred that $RE_2BaCuO_5$ is contained in an amount of from 0.01 to 1.5 mols per mol of $REBa_2Cu_3O_y$. More preferably, $RE_2BaCuO_5$ is within a range of from 0.3 to 0.5 mol per mol of $REBa_2Cu_3O_y$.

In order to obtain a superconductor having such a structure, it is preferred to use as a starting material the one obtained by adding the above double oxide crystals to a mixture obtained by adding a raw material having a composition of $RE_2BaCuO_5$ to a raw material having a composition of $REBa_2Cu_3O_y$ and to melt the starting material, followed by solidification. In such a system, growth of $RE_2BaCuO_5$ particles is suppressed by the addition of the above compound oxide, and a number of fine particles will be dispersed, whereby the pinning effects of the $RE_2BaCuO_5$ phase will also increase.

In the production of a superconductor of RE-Ba-Cu-O system by a melting and solidification method, it is preferred that at least two RE elements are contained, since the particle size of the $RE_2BaCuO_5$ phase tends to be fine (0.5 to a few $\mu$m) as compared with a case where only one type of rare earth element is contained. By the combination of this with the addition of the above double oxide, it is possible to obtain a structure wherein fine particles are dispersed throughout the entire material. This is believed due to the fact that the finer the particle size of the $RE_2BaCuO_5$ phase, the more uniformly the above double oxide tends to be dispersed.

The above double oxide used in the present invention has a low reactivity with the oxide superconductor. Therefore, it can be suitably used as an interlayer for baking a thick film on a metal substrate, or for preparing a thin film on the substrate by a gas phase method.

Now, the present invention will be described in further detail with reference to Examples. However, it should be understood that the present invention is by no means restricted to such specific Examples.

EXAMPLE 1

With respect to the combination of RE and M as shown in Table 1, a calcined powder of oxides was prepared so that the atomic ratio of RE:Ba:Cu was 7:8:11 (molar ratio of $REBa_2Cu_3O_y$:$RE_2BaCuO_5$ = 6:4). To this powder, $BaMO_3$ having an average particle size of 0.5 $\mu$m was added in an amount of from 2 to 12 vol % and mixed. Then, the powder mixture was compression-molded by a mold to obtain a compact of 70 mm×40 mm×2 mm, and the compact was sintered in an oxygen stream at 930° C. for 10 hours. In a system wherein Y and Ho were used in combination as RE, the atomic ratio of Y:Ho was adjusted to 7:8. After cooling, the sintered product was cut into an angular bar shape of 70 mm×4 mm×2 mm by means of a diamond cutter.

Then, one end of this angular bar-shaped sintered product was secured, and the sintered product was moved at a rate of 2 mm/hr in an electric furnace having a temperature gradient of 50° C./cm in an oxygen stream at a maximum temperature portion of 1080° C., to melt and solidify in one direction i.e. in the axial direction.

The solidified product thereby obtained was further heated to 700° C. in an oxygen atmosphere, then gradually cooled at a rate of 15° C./hr and maintained at 450° C. for 40 hours.

The solidified product thus obtained was observed by a scanning electron microscope and an X-ray microanalyzer, whereby it was confirmed to have a structure wherein, as shown in FIG. 1, plate crystals of 123-phase were overlaid one on another in a layered fashion, and $BaMO_3$ particles and crystal particles of 211-phase having particle sizes of about 0.5 μm are insularly dispersed therein. In a case where the amount of $BaMO_3$ incorpoated was less than 10 vol %, a good structure as described above was observed over the entire test sample, and no precipitation of crystals such as $BaCuO_2$ was observed. When the amount of $BaMO_3$ was 10 vol % or higher, segregation of $BaMO_3$ was partially observed, and at such portions, the continuous structure of the superconductor crystal was interrupted.

The superconducting characteristics were measured, and the results are shown in Table 1. For the measurement, a test sample cut into a size of 1 mm×0.1 mm×10 mm was used. The critical temperature Tc was measured by a four-point-probe method and represented by the temperature showing zero resistance. The critical current density Jc was likewise measured by a four-point-probe method in a state where an external magnetic field of 5 tesla was applied at the liquid nitrogen temperature (77° K.). No particular difference in the critical current density was observed among different portions of the test sample.

TABLE 1

| RE | M | Amount of $BaMO_3$ (vol %) | Tc (end) (K) | Jc (77 K, 5 T) (A/cm$^2$) |
| --- | --- | --- | --- | --- |
| Y | Zr | 8 | 91 | 3900 |
| Y | Zr | 4 | 91 | 3300 |
| Y | Zr | 12 | 90 | 2300 |
| Y | Ce | 8 | 90 | 3600 |
| Y | Ti | 8 | 89 | 3500 |
| Y | Sn | 2 | 92 | 2000 |
| Y | Sn | 8 | 92 | 6100 |
| Y | Sn | 9 | 92 | 6000 |
| Y | Sn | 10 | 91 | 3200 |
| Y | Sn | 12 | 91 | 2400 |
| Y, Ho | Sn | 8 | 92 | 7200 |

EXAMPLE 2

With respect to the combination of RE and M as shown in Table 2, a calcined powder of oxides was prepared so that the atomic ratio of RE:Ba:Cu was 7:8:11. To this powder, $BaMO_3$ having an average particle size of 0.3 μm was added in an amount of from 2 to 12 vol % and mixed. Then, the powder mixture was compression-molded by a mold to obtain a compact of 70 mm×40 mm×2 mm, and the compact was sintered in an oxygen stream at 930° C. for 10 hours. In a system wherein Y and Ho were used in combination as RE, the atomic ratio of Y:Ho was adjusted to 7:8. After cooling, the sintered product was cut into an angular bar shape of 70 mm×4 mm×2 mm by means of a diamond cutter.

Then, one end of this angular bar-shaped sintered product was secured, and the sintered product was moved at a rate of 2 mm/hr in an electric furnace having a temperature gradient of 50° C./cm in an oxygen stream at a maximum temperature portion of 1080° C., to melt and solidify in one direction i.e. in the axial direction.

The solidified product thereby obtained was further heated to 700° C. in an oxygen atmosphere, then gradually cooled at a rate of 15° C./hr and maintained at 450° C. for 40 hours.

The solidified product thus obtained was observed by a scanning electron microscope and an X-ray microanalyzer, whereby as in the case of Example 1, it was confirmed to have a structure in which, as shown in FIG. 1, plate crystals of 123-phase were overlaid one on another in a layered fashion, and $BaMO_3$ particles and crystal particles of 211-phase having a particle size of about 0.3 μm were insularly dispersed therein. When the amount of $BaMO_3$ incorporated was less than 10 vol %, a good structure as described above was observed over the entire test sample, and no precipitation of crystals such as $BaCuO_2$ was observed. When the amount of $BaMO_3$ was 10 vol % or higher, segregation of $BaMO_3$ was partially observed, and at such portions, the continuous structure of the superconductor crystal was interrupted.

The superconducting characteristics as measured in the same manner as in Example 1 are show in Table 2. No particular difference in the critical current density was observed among different portions of the test sample.

TABLE 2

| RE | M | Amount of $BaMO_3$ (vol %) | Tc (end) (K) | Jc (77 K, 5 T) (A/cm$^2$) |
| --- | --- | --- | --- | --- |
| Y | Zr | 8 | 91 | 7200 |
| Y | Zr | 4 | 91 | 5300 |
| Y | Zr | 12 | 90 | 4300 |
| Yb | Ce | 8 | 89 | 5900 |
| Y | Ti | 8 | 90 | 5800 |
| Y | Sn | 2 | 92 | 2300 |
| Y | Sn | 8 | 92 | 7700 |
| Y | Sn | 9 | 92 | 7700 |
| Y | Sn | 10 | 91 | 5900 |
| Y | Sn | 12 | 91 | 2600 |
| Ho | Sn | 8 | 91 | 7900 |
| Y, Ho | Sn | 8 | 92 | 9800 |
| Y, Ho | Sn | 9 | 91 | 9200 |

COMPARATIVE EXAMPLE 1

With respect to RE as shown in Table 3, a calcined powder of oxides was prepared so that the atomic ratio of RE:Ba:Cu was 7:8:11. This powder was compression-molded by a mold to obtain a compact of 70 mm×40 mm×2 mm, and the compact was sintered in an oxygen stream at 930° C. for 10 hours. In a system wherein Y and Ho were used in combination as RE, the atomic ratio of Y:Ho was adjusted to 7:8. After cooling, the sintered product was cut into an angular bar shape of 70 mm×4 mm×2 mm by means of a diamond cutter.

Then, one end of this angular-shaped sintered product was secured, and the sintered product was moved at a rate of 2 mm/hr in an electric furnace having a temperature gradient of 50° C./cm in an oxygen stream at a maximum temperature portion of 1080° C., to melt and solidify in one direction i.e. in the axial direction.

The solidified product thereby obtained was further heated to 700° C. in an oxygen atmosphere, then gradually cooled at a rate of 15° C./hr and maintained at 450° C. for 40 hours.

Figure 2:
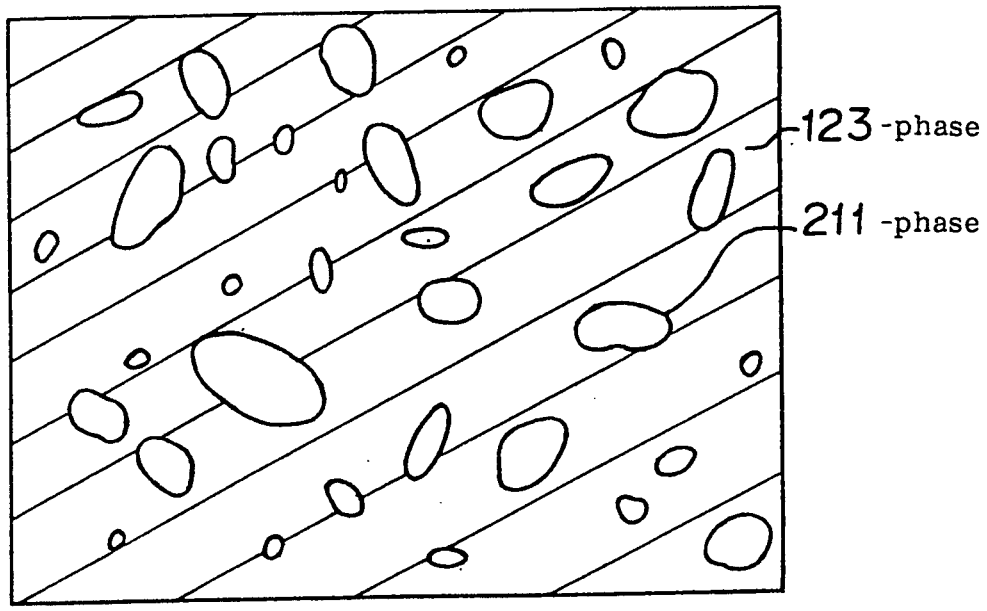
FIG. 2 is a diagrammatical view illustrating the structure of the superconductor obtained in Comparative Example 1.

The solidified product thus obtained was observed by a scanning electron microscope and an X-ray microanalyzer, whereby it was confirmed to have a structure in which, as shown in FIG. 2, plate crystals of 123-phase were overlaid one on another in a layered fashion, and crystal particles of 211-phase were insularly dispersed therein. As compared with the structures of the preceding Examples, fine particles of 211-phase were less.

The superconducting characteristics measured in the same manner as in Example 1 are shown in Table 3. The dispersion of the 211-phase in the test sample was non-uniform, and a difference of from 2 to 3 times in the critical current density were observed among different portions of the test sample.

TABLE 3

| RE | Tc (end) (K) | Jc (77 K, 5 T) (A/cm$^2$) |
| --- | --- | --- |
| Y | 90 | 1200 |
| Yb | 92 | 900 |
| Y, Ho | 92 | 3100 |

EXAMPLE 3

With respect to RE as shown in Table 4, a calcined powder of oxides was prepared so that the atomic ratio of RE:Ba:Cu was 7:8:11. To this powder, BaMO$_3$ having an average particle size of 0.5 μm was added in an amount of 8 vol % and mixed. To this powder mixture, an acrylic binder was added and formed into a thick film green sheet having a thickness of 50 μm by a doctor blade method. In a system wherein Y and Ho were used in combination as RE, the atomic ratio of Y:Ho was adjusted to 7:8.

The above green sheet was placed on a silver foil tape having a thickness of 50 μm and having metallic copper plated on its surface in a thickness of 7 μm and heated at 920° C. in an oxygen stream, whereby copper on the tape surface and the calcined oxide powder were reacted to form a molten state. The system was maintained in the molten state for 5 hours and then cooled, whereby a crystal structure grown with the a-b face of the REBa$_2$Cu$_3$O$_y$ crystals oriented in parallel with the tape surface, was obtained.

Then, this tape material was unidirectionally solidified in the longitudinal direction of the tape at a rate of 2 mm/hr using an electric furnace having a temperature gradient of 50° C./cm in an oxygen stream at a maximum temperature portion of 930° C., whereby the REBa$_2$Cu$_3$O$_y$ crystals were oriented more strongly.

The fine structure of the interior of the REBa$_2$Cu$_3$O$_y$ crystals was observed by a scanning electron microscope and a transmission electron microscope, whereby granular crystals of 211-phase and the BaMO$_3$-phase which underwent no substantial grain growth as compared with the grains as charged, were uniformly dispersed in the interior of the crystals.

This silver substrate tape material was cut into a size of 1 mm × 10 mm, and the superconducting characteristics were measured. The critical temperature Tc was represented by the temperature showing zero resistance as measured by a four-point-probe method. The critical current density Jc was likewise measured by a four-point-probe method in such a state that an external electric field of 1 tesla was applied at the liquid nitrogen temperature (77° K.). Here, the magnetic field was applied in parallel with the c-axis of the 123-phase. The results are shown in Table 4.

TABLE 4

| RE | M | Tc (end) (K) | Jc (77 K, 1 T) (A/cm$^2$) |
| --- | --- | --- | --- |
| Y | Zr | 91 | 3500 |
| Y | Sn | 92 | 3800 |
| Y, Ho | Zr | 91 | 4700 |
| Y, Ho | Ce | 90 | 3900 |
| Y, Ho | Sn | 92 | 5100 |
| Y, Ho | Ti | 90 | 4100 |

COMPARATIVE EXAMPLE 2

A superconductor tape material was prepared in the same manner as in Example 3 except that a calcined powder of oxides was prepared so that the atomic ratio of Y:Ba:Cu was 7:8:11, and BaMO$_3$ was not added.

The measurements were conducted in the same manner as in Example 3, whereby this tape material was found to have a critical temperature of 92° K. The Jc value in the applied magnetic field of one tesla at a temperature of 77° K. was 560 A/cm$^2$.

EXAMPLE 4

With respect to RE as shown in Table 5, a calcined powder of oxides was prepared so that the atomic ratio of RE:Ba:Cu was 7:8:11. To this powder, BaMO$_3$ having an average particle size of 0.5 μm was added in an amount of 8 vol % and mixed. To this powder mixture, an acrylic binder was added and formed into a thick film green sheet having a thickness of 50 μm by a doctor blade method. In a system wherein Y and Ho were used in combination as RE, the atomic ratio of Yb:Ho was adjusted to 9:2.

This green sheet was placed on an alloy foil tape comprising 80% of gold and 20% of palladium, then heated to 1000° C. in an oxygen stream to melt the calcined oxide powder, maintained in this state for 5 hours and then cooled. As a result, a crystal structure grown with the a-b face of the REBa$_2$Cu$_3$O$_y$ crystals oriented in parallel with the tape surface, was obtained.

Then, this tape material was unidirectionally solidified by moving it in a longitudinal direction of the tape at a rate of 10 mm/hr using an electric furnace having a temperature gradient of 50° C./cm in an oxygen stream at a maximum temperature portion of 1020° C. After the heat treatment, the REBa$_2$Cu$_3$O$_y$ crystals on the tape material were found to be oriented more strongly.

The fine structure of the interior of the REBa$_2$Cu$_3$O$_y$ crystals was observed by a scanning electron microscope and a transmission electron microscope, whereby granular crystals of 211-phase and a BaMO$_3$-phase which underwent no substantial grain growth as compared with the grains as charged, were uniformly dispersed in the interior of the crystals.

With respect to this gold-palladium alloy substrate tape wire material, the critical temperature and Jc in the magnetic field of one tesla at the liquid nitrogen temperature (77° K.) were measured in the same manner as in Example 3. The results are shown in Table 5.

TABLE 5

| RE | M | Tc (end) (K) | Jc (77 K, 1 T) (A/cm$^2$) |
|---|---|---|---|
| Y | Zr | 91 | 5300 |
| Y | Sn | 92 | 5800 |
| Y, Ho | Zr | 91 | 6900 |
| Y, Ho | Sn | 92 | 7200 |
| Yb, Ho | Sn | 92 | 8000 |

COMPARATIVE EXAMPLE 3

A superconductor tape wire material was prepared in the same manner as in Example 5 except that a calcined powder of oxides were prepared so that the atomic ratio of Y:Ba:Cu was 7:8:11, and BaMO$_3$ was not added.

This superconductor had a critical temperature of 92° K. The Jc value in an applied magnetic field of one tesla at a temperature of 77° K. was 680 A/cm$^2$.

What is claimed is:

1. A crystalline oxide superconductor which contains RE, Ba and Cu as constituting elements, wherein RE is at least one member selected from the group consisting of Y, La, Nd, Sm, Eu, Gd, Dy, Ho, Er, Tm, Yb and Lu, and in which is dispersed from 5 to 20 vol % of a perovskite double oxide of the formula BaBO$_3$, wherein B is at least one metal selected from the group consisting of Zr, Sn, Ce and Ti.

2. The oxide superconductor according to claim 1, wherein said perovskite double oxide is BaSnO$_3$.

3. The oxide superconductor according to claim 1, wherein crystalline said oxide superconductor have the compositional formula REBa$_2$Cu$_3$O$_y$, wherein the value of $y$ is determined by the processing of calcined RE, Ba and Cu oxides, which constitute the superconductor oxide, in an oxygen atmosphere at elevated temperature under compression molding and sintering conditions.

4. The oxide superconductor according to claim 3, having a structure such that crystals of the formula RE$_2$BaCuO$_5$ are dispersed, together with crystals of said perovskite double oxide of the formula BaBO$_3$ in REBa$_2$Cu$_3$O$_y$ crystals.

5. The oxide superconductor according to claim 1, wherein the amount of said perovskite double oxide dispersed in the oxide superconductor crystals ranges from 5 to 12 vol %.

* * * * *